(12) United States Patent
Lee et al.

(10) Patent No.: US 9,099,624 B2
(45) Date of Patent: Aug. 4, 2015

(54) SEMICONDUCTOR LIGHT EMITTING DEVICE AND PACKAGE

(71) Applicant: Samsung Electronics Co., Ltd, Suwon-si, Gyeonggi-do (KR)

(72) Inventors: Wan Ho Lee, Goyang (KR); Gi Bum Kim, Hwaseong (KR); Si Hyuk Lee, Anyang (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 77 days.

(21) Appl. No.: 13/677,072

(22) Filed: Nov. 14, 2012

(65) Prior Publication Data

US 2013/0119423 A1  May 16, 2013

(30) Foreign Application Priority Data

Nov. 14, 2011  (KR) .................. 10-2011-0118101

(51) Int. Cl.
*H01L 33/58* (2010.01)
*H01L 33/44* (2010.01)

(52) U.S. Cl.
CPC ................. *H01L 33/58* (2013.01); *H01L 33/44* (2013.01)

(58) Field of Classification Search
CPC ..... H01L 33/58; H01L 51/5275; H01L 33/50; H01L 33/08; H01L 33/24; H01L 33/52; H01L 33/06; H01L 51/5203

USPC .............................. 257/98, E21.159, E21.002
See application file for complete search history.

(56) References Cited

U.S. PATENT DOCUMENTS

| | | | |
|---|---|---|---|
| 2005/0179052 A1 | 8/2005 | Yi et al. | |
| 2008/0305567 A1* | 12/2008 | Song | ................. 438/31 |
| 2008/0315229 A1 | 12/2008 | Yi et al. | |
| 2012/0089117 A1* | 4/2012 | Junginger et al. | ........... 604/506 |
| 2014/0151633 A1* | 6/2014 | Jung et al. | ........................ 257/13 |

FOREIGN PATENT DOCUMENTS

| KR | 2005-0088961 A | 9/2005 |
|---|---|---|
| KR | 10-0644166 B1 | 11/2006 |
| KR | 2010-0114687 A | 10/2010 |

\* cited by examiner

*Primary Examiner* — Cathy N Lam
(74) *Attorney, Agent, or Firm* — McDermott Will & Emery LLP

(57) ABSTRACT

A semiconductor light emitting device and package containing the same include: a light emitting structure including a first conductivity-type semiconductor layer, an active layer, and a second conductivity-type semiconductor layer. A light extraction layer is disposed on the light emitting structure and includes a light-transmissive thin film layer having light transmittance, a nano-rod layer including nano-rods disposed on the light-transmissive thin film layer, and a nano-wire layer including nano-wires disposed on the nano-rod layer.

1 Claim, 3 Drawing Sheets

SEMICONDUCTOR LIGHT EMITTING DEVICE AND PACKAGE

CROSS-REFERENCE TO RELATED APPLICATIONS

This application claims the priority of Korean Patent Application No. 10-2011-0118101 filed on Nov. 14, 2011, in the Korean Intellectual Property Office, the disclosure of which is incorporated herein by reference.

TECHNICAL FIELD

The present application relates to a semiconductor light emitting device and package containing the same.

BACKGROUND

In general, a nitride semiconductor material has been widely used in a green or blue light emitting diode (LED) or in a laser diode provided as a light source in a full-color display, an image scanner, various signaling systems, or in an optical communications device. A nitride semiconductor light emitting device may be provided as a light emitting device having an active layer emitting light of various colors, including blue and green, through the recombination of electrons and holes.

As remarkable progress has been made in the area of nitride semiconductor light emitting devices since they were first developed, the utilization thereof has been greatly expanded and research into utilizing semiconductor light emitting devices as light sources of general illumination devices and electronic devices, has been actively undertaken. In particular, related art nitride light emitting devices have largely been used as components of low-current/low-output mobile products, and recently, the utilization of nitride light emitting devices has extended into the field of high-current/high-output devices. Thus, research into improving luminance efficiency and the quality of semiconductor light emitting devices has been actively conducted.

In terms of the luminance efficiency of a semiconductor light emitting device, light generated from an active layer is trapped and lost in the interior of semiconductor due to total internal reflection caused by a difference between refractive indices of air and the semiconductor layer, degrading light extraction efficiency. For example, GaN has a refractive index of about 2.5, and only about 4% of light made incident at 23° due to a difference between the refractive index of GaN and the refractive index (about 1) of air can escape to the outside. Thus, in order to minimize such light loss, research into enhancing light extraction efficiency by forming depressions and protrusions on a GaN surface has been ongoing.

Thus, a need exists for further improvement, for example, in terms of enhanced light extraction efficiency, optical power and luminous intensity uniformity in semiconductor light emitting devices.

SUMMARY

An aspect of the present application provides a semiconductor light emitting device having enhanced light extraction efficiency.

Another aspect of the present application provides a semiconductor light emitting device having both improved optical power and luminous intensity uniformity.

According to an aspect of the present application, there is provided a semiconductor light emitting device including: a light emitting structure including a first conductivity-type semiconductor layer, an active layer, and a second conductivity-type semiconductor layer; and a light extraction layer disposed on the light emitting structure and including a light-transmissive thin film layer having light transmittance, a nano-rod layer including a plurality of nano-rods disposed on the light-transmissive thin film layer, and a nano-wire layer including a plurality of nano-wires disposed on the nano-rod layer.

The light-transmissive thin film layer, the nano-rod layer, and the nano-wire layer may have refractive indices gradually reduced in a sequential manner.

The light-transmissive thin film layer, the nano-rod layer, and the nano-wire layer may have a single refractive index therein, respectively.

The light-transmissive thin film layer, the nano-rod layer, and the nano-wire layer may be made of the same material.

The light-transmissive thin film layer may be made of a material having light transmittance and electrical conductivity.

The light-transmissive thin film layer may be a transparent conductive oxide or a transparent conductive nitride.

The light-transmissive thin film layer may have a refractive index smaller than that of the second conductivity-type semiconductor layer.

The semiconductor light emitting device may further include: a first electrode formed to be electrically connected to the first conductivity-type semiconductor layer; and a second electrode disposed on the light-transmissive thin film layer and electrically connected to the second conductivity-type semiconductor layer.

The light-transmissive thin film layer may be disposed on the second conductivity-type semiconductor layer.

The semiconductor light emitting device may further include a substrate for growth of semiconductor having one surface on which the first conductivity-type semiconductor layer, the active layer, and the second conductivity-type semiconductor layer of the light emitting structure are sequentially formed.

The light extraction layer may be disposed on a surface of the substrate for growth of semiconductor opposed to the surface on which the light emitting structure is formed.

The semiconductor light emitting device may further include: a first electrode disposed on a portion of the first conductivity-type semiconductor layer exposed by removing at least portions of the second conductivity-type semiconductor layer, the active layer, and the first conductivity-type semiconductor layer; and a second electrode disposed on the second conductivity-type semiconductor layer.

The surface of the substrate for growth of semiconductor on which the light extraction layer is formed may be provided as a main light extraction surface.

The semiconductor light emitting device may further include: a conductive substrate disposed on the second conductivity-type semiconductor layer.

The light extraction layer may be disposed on the first conductivity-type semiconductor layer. Another aspect of the present application includes semiconductor light emitting device package including a light emitting structure, a light extraction layer, a first electrode, a second electrode, a first terminal unit electrically connected to the first electrode and a second terminal unit electrically connected to the second electrode. The light emitting structure includes a first conductivity-type semiconductor layer, an active layer, and a second conductivity-type semiconductor layer. The light extraction layer is disposed on the light emitting structure. The light extraction layer includes a light-transmissive thin film layer having light transmittance, a nano-rod layer including nano-rods disposed on the light-transmissive thin film layer, and a nano-wire layer including nano-wires disposed on the nano-rod layer. The first electrode formed to be electrically connected to the first conductivity-type semiconductor layer, and the second electrode formed to be electrically connected to the second conductivity-type semiconductor layer.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
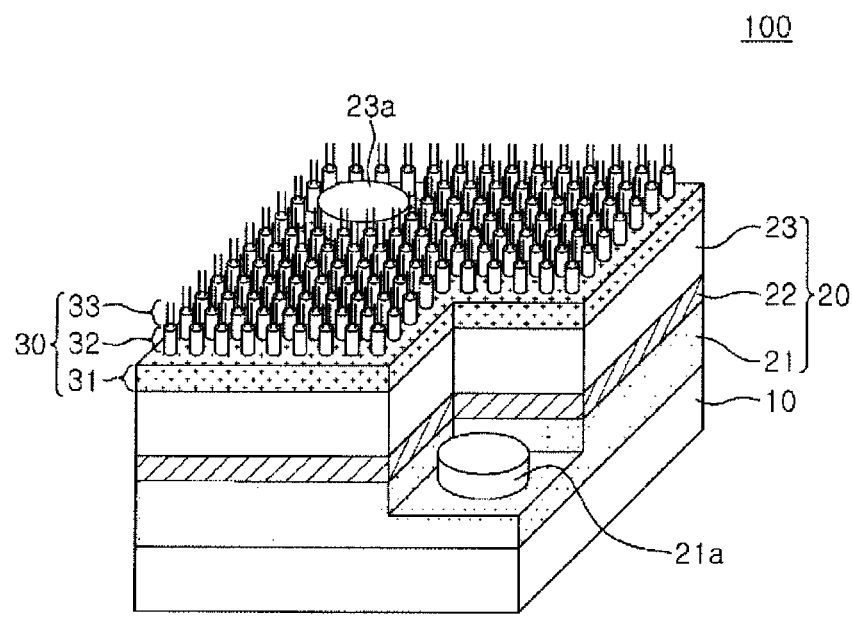
FIG. 1 is a perspective view schematically showing a semiconductor light emitting device according to a first example of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Examples of the present application will now be described in detail with reference to the accompanying drawings.

The application may, however, be embodied in many different forms and should not be construed as being limited to the examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like components.

FIG. 1 is a perspective view schematically showing a semiconductor light emitting device according to a first example of the present application.

With reference to FIG. 1, a semiconductor light emitting device 100 according to the present example may include a light emitting structure 20 including a first conductivity-type semiconductor layer 21, an active layer 22, and a second conductivity-type semiconductor layer 23, and a light extraction layer 30 disposed on the light emitting structure 20. The light extraction layer 30 may include a light-transmissive thin film layer 31 having light transmittance, a nano-rod layer 32 including a plurality of nano-rods disposed on the light-transmissive thin film layer 32, and a nano-wire layer 33 including a plurality of nano-wires disposed on the nano-rod layer 32.

The light emitting structure 20 may be disposed on the substrate for growth of semiconductor 10, and first and second electrodes 21a and 23a may be disposed on the first and second conductivity-type semiconductor layers 21 and 23 of the light emitting structure 20 and electrically connected to the first and second conductivity-type semiconductor layers 21 and 23, respectively.

As the substrate for growth of semiconductor 10, a substrate made of a material such as sapphire, SiC, $MgAl_2O_4$, MgO, $LiAlO_2$, $LiGaO_2$, GaN, or the like, may be used. In this case, sapphire is a crystal having Hexa-Rhombo R3c symmetry, of which lattice constants in c-axis and a-axis directions are 13.001 Å and 4.758 Å, respectively. The sapphire crystal has a C plane (0001), an A plane (1120), an R plane (1102), and the like. In this case, a nitride thin film may be relatively easily disposed on the C plane of the sapphire crystal and because sapphire crystal is stable at high temperatures, sapphire crystal is commonly used as a material for a nitride growth substrate. A buffer layer (not shown) may be employed as an undoped semiconductor layer made of a nitride, or the like, to alleviate a lattice defect in the semiconductor layer grown thereon.

In the present example, the first and second conductivity-type semiconductor layers 21 and 23 may be n-type and p-type semiconductor layers, respectively, and may be made of a nitride semiconductor. Thus, in the present example, the first and second conductivity-types may be understood to indicate n-type and p-type conductivities, respectively, but the present application is not limited thereto. The first and second conductivity-type semiconductor layers 21 and 23 may be made of a material expressed by an empirical formula $Al_xIn_yGa_{(1-x-y)}N$ (here, $0 \leq x \leq 1$, $0 \leq y \leq 1$, $0 \leq x+y \leq 1$), and such a material may include GaN, AlGaN, InGaN, and the like.

The active layer 22 formed between the first and second conductivity-type semiconductor layers 21 and 23 emits light having a certain level of energy according to electron and hole recombination, and may have a multi-quantum well (MQW) structure in which quantum well layers and quantum barrier layers are alternately laminated. Here, the MQW structure may be, for example, an InGaN/GaN structure. Meanwhile, the first and second conductivity-type semiconductor layers 21 and 23 and the active layer 22 may be formed by using a semiconductor layer growth process such as metal organic chemical vapor deposition (MOCVD), hydride vapor phase epitaxy (HYPE), molecular beam epitaxy (MBE), or the like, known in the art.

First and second electrodes 21a and 23a may be disposed on the first and second conductivity-type semiconductor layers and 23 and electrically connected to the second conductivity-type semiconductor layers 21 and 23, respectively. As illustrated in FIG. 1, the first electrode 21a may be disposed on the first conductivity-type semiconductor layer 21 exposed as portions of the second conductivity-type semiconductor layer 23, the active layer 22, and the first conductivity-type semiconductor layer 21 are etched, and the second electrode 23a may be disposed on the second conductivity-type semiconductor layer 23.

In this case, a transparent electrode made of ITO, ZnO, or the like, may further be provided between the second conductivity-type semiconductor layer 23 and the second electrode 23a in order to enhance an ohmic-contact function between the second conductivity-type semiconductor layer 23 and the second electrode 23a. In the case of the structure illustrated in FIG. 1, the first and second conductivity-type electrodes 21a and 23a are formed to face in the same direction, but the position and connection structure of the first and second electrodes 21a and 23a may be variably modified as necessary. Also, although not shown, a branch electrode may further be provided such that it extends from the first electrode 21a in order to uniformly distribute a current. Here, the first electrode 21a may be understood as being a bonding pad.

The light extraction layer 30 may be disposed on the second conductivity-type semiconductor layer 23 and include the light-transmissive thin film layer 31, the nano-rod layer 32, and the nano-wire layer 33. The light-transmissive thin film layer 31, the nano-rod layer 32, and the nano-wire layer 33 may be formed to have a single refractive index therein, respectively, and the refractive indices are gradually reduced in a sequential manner toward the nano-wire layer 33 from the light-transmissive thin film layer 31. Here, the light-transmissive thin film 31 has a refractive index smaller than that of the second conductivity-type semiconductor layer 23, thus having refractive indexes gradually reduced in a sequential manner in a direction in which light proceeds from the second conductivity-type semiconductor layer 23.

In the present example, the nano-rod layer 32 includes a plurality of nano-rods disposed on an upper surface of the light-transmissive thin film layer 31, so the nano-rod layer 32 has a low level of porosity or density due to air present between the plurality of nano-rods. Also, the nano-wire layer 33 includes a plurality of nano-wires having a width smaller than that of the plurality of nano-rods constituting the nano-rod layer 32, thus having a lower level of porosity or density than that of the nano-rod layer 32. Thus, the nano-rod layer and the nano-wire layer 33 may have refractive indices gradually reduced in a sequential manner from the light-transmissive thin film layer 31, respectively.

The nano-rod layer 32 and the nano-wire layer 33 may serve as a single layer having a single refractive index therein, respectively. Air has a low refractive index (about 1), so as the specific gravity of air in the nano-rod layer 32 and the nano-wire layer 33 is increased, the nano-rod layer 32 and the nano-wire layer 33 have a decreased refractive index, respectively, and thus, the refractive indices of the nano-rod layer 32 and the nano-wire layer 33 can be controlled by adjusting the porosity or density of the nano-rod layer 32 and the nano-wire layer 33.

When light proceeds from a region having a higher refractive index toward a region having a lower refractive index, light made incident at a critical angle or greater is totally internally reflected, rather than being refracted, and when there is a significant difference between the refractive indices, a greater amount of light is totally internally reflected. In the present example, in order to reduce a proportion of light from being totally internally reflected and becoming trapped within the light emitting structure 20 when light proceeds from the light emitting structure 20 to the outside (the refractive index of air: 1), the light extraction layer 30 having a refractive index gradually reduced in a sequential manner from the light emitting structure 20 is provided to increase light extraction efficiency.

The light-transmissive thin film layer 31, the nano-rod layer 32, and the nano-wire layer 33 constituting the light extraction layer 30 may be made of a material having light-transmittance (i.e., transparency or translucency) and electrical conductivity. For example, a transparent conductive oxide (TCO) or a transparent conductive nitride (TCN) may be used. Here, the transparent conductive oxide may be ITO, CIO, or ZnO. In the present example, the light-transmissive thin film layer 31, the nano-rod layer 32, and the nano-wire layer 33 may be made of the same material, but the present application is not limited thereto.

The light extraction layer 30 may be formed through a known deposition process, e.g., metal organic chemical vapor deposition (MOCVD), molecular beam epitaxy (MBE), sputtering, or the like. In detail, the light extraction layer 30 may be formed by bringing vapor of an organic metal precursor into contact with the substrate according to MOCVD or by growing a target material on the substrate or the semiconductor layer by irradiating beams according to MBE. In the case of forming the light extraction layer 30 through MOCVD, the light extraction layer 30 may be formed to have a desired shape by adjusting conditions such as an inflow amount, a deposition temperature and time, or the like, of introduced reactive gases.

For example, the nano-rod layer 32 and the nano-wire layer 33 may be disposed on the light-transmissive thin film layer 31 through a continuous deposition process by adjusting a catalyst or deposition temperature. Here, the width of the grown nano rods may be reduced by increasing the temperature during the deposition process, and thus, the nano-rod layer 32 and the nano-wire layer 33 may be sequentially disposed on the light-transmissive thin film layer 31 by controlling the temperature during the continuous process.

The second electrode 23a electrically connected to the second conductivity-type semiconductor layer 23 may be disposed on the light-transmissive thin film layer 31 of the light extraction layer 30. Here, the light-transmissive thin film layer 1 may be made of a material having light transmittance and electrical conductivity. For example, the light-transmissive thin film layer 1 may be made of a transparent conductive oxide or a transparent conductive nitride. Since the second electrode 23a for receiving an electrical signal from the outside is disposed on the light-transmissive thin film layer 31, a current spreads in a lateral direction by the light-transmissive thin film layer 31, obtaining a current dispersion effect and enhancing luminous intensity uniformity.

Figure 2:
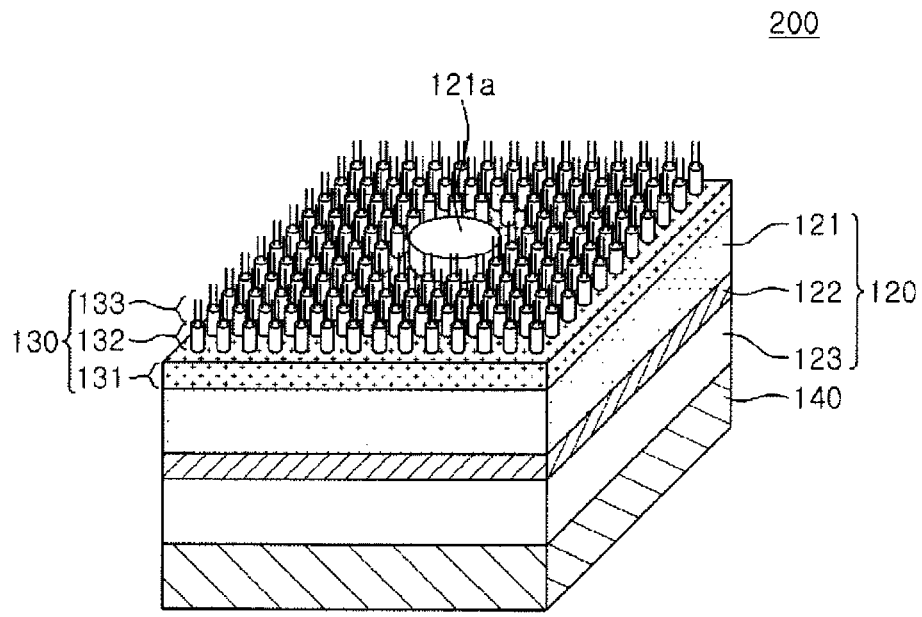
FIG. 2 is a perspective view schematically showing a semiconductor light emitting device according to a second example of the present application.

FIG. 2 is a perspective view schematically showing a semiconductor light emitting device according to a second example of the present application.

With reference to FIG. 2, a semiconductor light emitting device 200 according to the present example may include a conductive substrate 140, a light emitting structure 120 disposed on the conductive substrate 140, and a light extraction layer 130 disposed on the light emitting structure 120.

The light emitting structure 120 may include a first conductivity-type semiconductor layer 121, an active layer 122, and a second conductivity-type semiconductor layer 123. A first electrode 121a for applying an external electrical signal to the first conductivity-type semiconductor layer 121 may be disposed on the first conductivity-type semiconductor layer 121.

The conductive substrate 140 may serve as a support for supporting a light emitting structure including the first and second conductivity-type semiconductor layers 121 and 123, the active layer 122 during a process such as laser lift-off, or the like, for eliminating a substrate for growth of semiconductor from the first conductivity-type semiconductor layer 121, the active layer 122, and the second conductivity-type semiconductor layer 123 sequentially disposed on the substrate for growth of semiconductor (not shown). The conductive substrate 140 may be made of a material including any one of gold (Au), nickel (Ni), aluminum (Al), copper (Cu), tungsten (W), silicon (Si), selenium (Se), and gallium arsenide (GaAs). For example, the conductive substrate 140 may be made of a material doped with Al on a Si substrate.

In the present example, the conductive substrate 140 may be joined to the light emitting structure by the medium of a conductive adhesive layer (not shown). The conductive adhesive layer may be made of a eutectic metal material such as, for example, AuSn, or the like. The conductive substrate 140 may serve as a second electrode applying an electrical signal to the second conductivity-type semiconductor layer 123, and as shown in FIG. 2, when the electrode is formed in a vertical direction, a current flow region may be enlarged to improve a current dispersion function.

Figure 3:
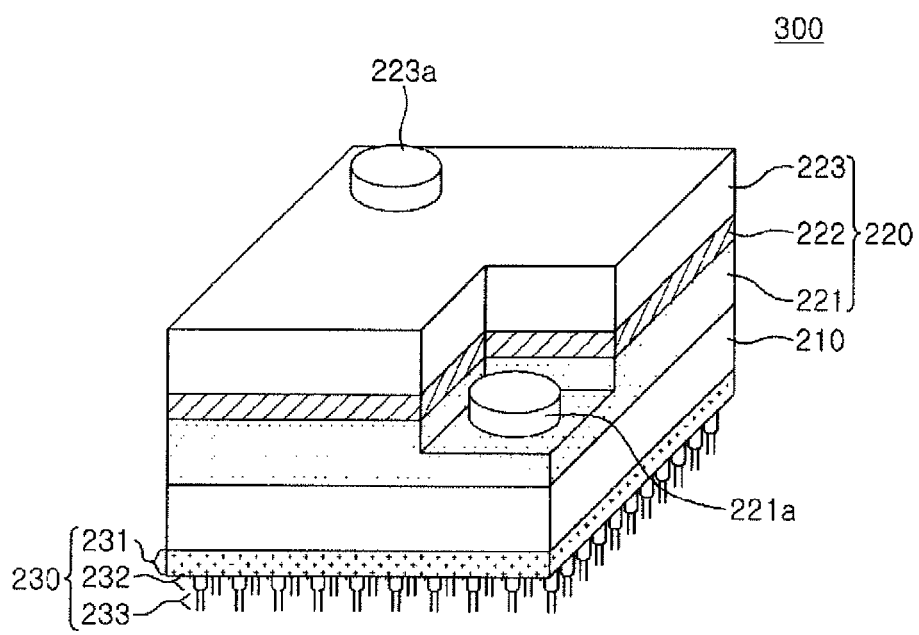
FIG. 3 is a perspective view schematically showing a semiconductor light emitting device according to a third example of the present application.

FIG. 3 is a perspective view schematically showing a semiconductor light emitting device according to a third example of the present application.

With reference to FIG. 3, a semiconductor light emitting device 300 may include a substrate for growth of semiconductor 210, a light emitting structure 220 disposed on the substrate for growth of semiconductor 210, and a light extraction layer 230 disposed on a surface of the substrate for growth of semiconductor 210 opposed to the surface of substrate for growth of semiconductor 210 on which the light emitting structure 220 is formed.

First and second electrodes 221a and 223a may be disposed on the first and second conductivity-type semiconductor layers 221 and 223 and electrically connected to the first and second conductivity-type semiconductor layers 221 and 223, respectively.

Unlike in the case of the first example illustrated in FIG. 1, in the present example, the light extraction layer 230 may be disposed on one surface of the substrate for growth of semiconductor 210, and here, the surface on which the light extraction layer 230 is formed may be provided as a main light extraction surface of the light emitting device. In this case, the light-transmissive thin film layer 231 is not provided as a current path, so it is not necessarily made of a material having electrical conductivity and may be made of a material having a refractive index smaller than that of the substrate for growth of semiconductor 210.

Figure 4A:
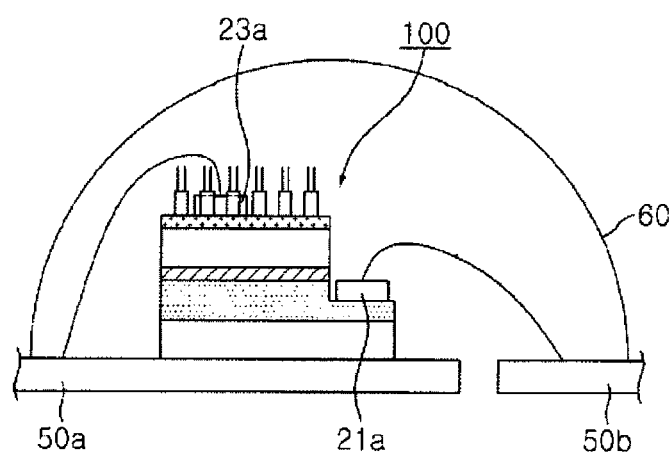
FIGS. 4A through 4C are schematic sectional views showing a mounting configuration of a semiconductor light emitting device package according to the first to third examples of the present application.
Figure 4B:
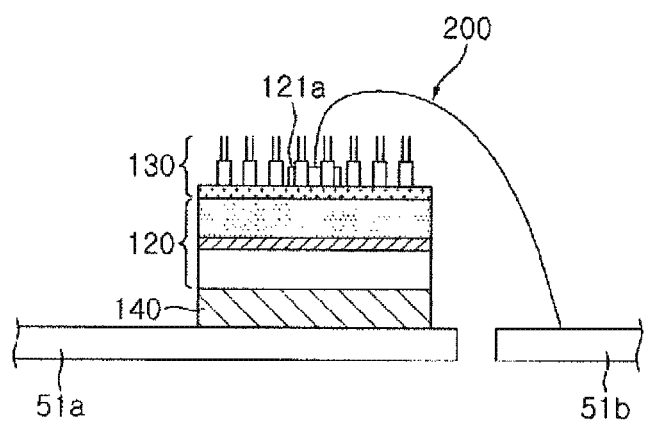
Figure 4C:
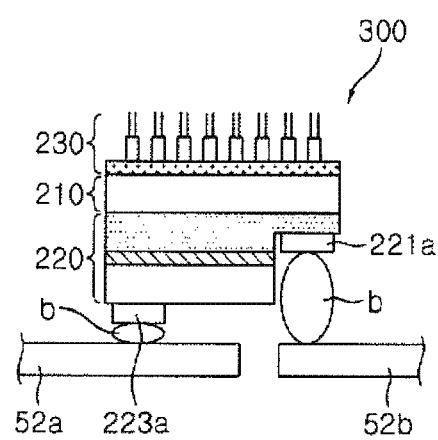

FIGS. 4A through 4C are schematic sectional views showing a mounting configuration of a semiconductor light emitting device package according to the first to third examples of the present application.

Specifically, FIG. 4A is a view showing an example of a mounting configuration of the semiconductor light emitting device 100 illustrated in FIG. 1; FIG. 4B is a view showing an example of a mounting configuration of the semiconductor light emitting device 200 illustrated in FIG. 2; and FIG. 4C is a view showing an example of a mounting configuration of the semiconductor light emitting device 300 illustrated in FIG. 3.

First, with reference to FIG. 4A, a light emitting device package according to the present example includes first and second terminal units 50a and 50b, and the semiconductor light emitting device 100 may be electrically connected to the first and second terminal units 50a and 50b, respectively. In this case, the first and second electrodes 21a and 23a disposed on the first and second conductivity-type semiconductor layers 21 and 23 of the semiconductor light emitting device 100 may be connected to the second and first terminal units 50b and 50a by conductive wires, respectively.

A lens unit 60 may be formed at above of the semiconductor light emitting device 100 to encapsulate the semiconductor light emitting device 100 and fix the semiconductor light emitting device 100 and the first and second terminal units 50a and 50b. The lens unit 60, having a hemispherical shape, may serve to reduce Fresnel reflection at an interface to increase light extraction, as well as protecting the semiconductor light emitting device 100 and the wires. Here, the lens unit 60 may be made of a resin which may include any one of epoxy, silicon, strained silicon, an urethane resin, an oxetane resin, acryl, polycarbonate, and polyimide. Also, depressions and protrusions may be disposed on an upper surface of the lens unit 60 to enhance light extraction efficiency and adjust a direction of emitted light. The shape of the lens unit 60 may be variably modified as necessary.

Although not shown, the lens unit 60 may include wavelength conversion phosphor particles for converting a wavelength of light emitted from the active layer of the semiconductor light emitting device 100. The phosphor may be a phosphor converting a wavelength of light into any one of yellow, red, and green, or a plurality of types of phosphors may be mixed to convert light into a plurality of wavelengths. The type of phosphors may be determined by a wavelength emitted from the active layer of the semiconductor light emitting device 100. In detail, the lens unit 60 may include at least one or more of phosphor materials among a YAG-based phosphor material, a TAG-based phosphor material, a silicate-based phosphor material, a sulfide-based phosphor material, and a nitride-based phosphor material. For example, when a phosphor for performing wavelength conversion to yellow light is applied to a blue LED chip, a white semiconductor light emitting device may be obtained.

With reference to FIG. 4B, a light emitting device package according to the present example includes first and second terminal units 51a and 51b and the semiconductor light emitting device 200 may be electrically connected to the first and second terminal units 51a and 51b. In this case, the first conductivity-type semiconductor layer 121 is wire-bonded to the second terminal unit 51b by the first electrode 121a formed thereon, and the second conductivity-type semiconductor layer 123 may be directly connected to the first terminal unit 51a through the conductive substrate 140.

FIG. 4C shows a mounting configuration of the semiconductor light emitting device 300 according to the third example of the present application. First and second electrodes 221a and 223a disposed on the first and second conductivity-type semiconductor layers 221 and 223 may be directly connected to first and second terminal units 52a and 52b by bump balls b, or the like, so as to be flip-chip bonded, respectively. In this case, the surface of the substrate for growth of semiconductor 210 on which the light extraction layer 230 is formed may be provided as a main light extraction surface.

However, the light emitting device packages illustrated in FIGS. 4A through 4C simply demonstrate how light emitting devices are mounted according to the first to third examples of the present application, and specific mounting configurations and methods may be variably modified as necessary.

As set forth above, according to examples of the application, since the light extraction layer having a gradually reduced refractive index in a sequential manner is formed by using the nano-structure including the nano-rods and nano-wires, the semiconductor light emitting device having enhance light extraction efficiency can be provided.

In addition, the semiconductor light emitting device having improved luminous intensity uniformity by maximizing a current dispersion effect, as well as having enhanced optical power, can be provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A semiconductor light emitting device comprising:
a light emitting structure including:
a first conductivity-type semiconductor layer,
an active layer, and
a second conductivity-type semiconductor layer; and
a light extraction layer disposed on the light emitting structure, the light extraction layer including:
a light-transmissive thin film layer having light transmittance,
a nano-rod layer including a plurality of nano-rods disposed on the light-transmissive thin film layer, and
a nano-wire layer including a plurality of nano-wires disposed on the nano-rod layer, wherein:
the plurality of nano-wires have a width smaller than a width of the plurality of nano-rods,
the light-transmissive thin film layer, the nano-rod layer, and the nano-wire layer have refractive indices gradually reduced in a sequential manner, and
the light-transmissive thin film layer, the nano-rod layer, and the nano-wire layer have a single refractive index therein, respectively.

* * * * *